United States Patent
Cho et al.

(10) Patent No.: US 10,135,335 B2
(45) Date of Patent: Nov. 20, 2018

(54) POWERSTAGE ATTACHED TO INDUCTOR

(71) Applicant: Infineon Technologies Americas Corp., El Segundo, CA (US)

(72) Inventors: Eung San Cho, Torrance, CA (US); Danny Clavette, Greene, RI (US)

(73) Assignee: Infineon Technologies Americas Corp., El Segundo, CA (US)

( * ) Notice: Subject to any disclaimer, the term of this patent is extended or adjusted under 35 U.S.C. 154(b) by 179 days.

(21) Appl. No.: 15/243,201

(22) Filed: Aug. 22, 2016

(65) Prior Publication Data

US 2018/0054119 A1  Feb. 22, 2018

(51) Int. Cl.
| | |
|---|---|
| *H01L 23/522* | (2006.01) |
| *H02M 3/158* | (2006.01) |
| *H01F 27/29* | (2006.01) |
| *H05K 3/30* | (2006.01) |

(52) U.S. Cl.
CPC .......... *H02M 3/158* (2013.01); *H01F 27/292* (2013.01); *H05K 3/303* (2013.01); *H01L 2224/40095* (2013.01); *H01L 2224/40137* (2013.01); *H01L 2224/40245* (2013.01); *H01L 2224/48091* (2013.01); *H01L 2224/48137* (2013.01); *H01L 2224/48247* (2013.01); *H01L 2924/181* (2013.01)

(58) Field of Classification Search
CPC ......... H01L 23/49805; H01L 23/49811; H01L 23/5227; H01L 23/645; H01L 28/10
See application file for complete search history.

(56) References Cited

U.S. PATENT DOCUMENTS

| | | | |
|---|---|---|---|
| 9,070,642 B2 | 6/2015 | Standing et al. | |
| 2015/0027770 A1* | 1/2015 | Chou | H01L 23/49811 174/266 |
| 2015/0116972 A1 | 4/2015 | Todorov et al. | |
| 2016/0276269 A1* | 9/2016 | Peng | H01L 23/5227 |
| 2017/0025363 A1* | 1/2017 | Tsai | H01L 23/645 |
| 2018/0053722 A1* | 2/2018 | Cho | H01L 28/10 |
| 2018/0053755 A1* | 2/2018 | Cho | H01L 23/49811 |

OTHER PUBLICATIONS

International Rectifier, Application Note AN-1136 Discrete Power Quad Flat No-Lead (PQFN) Board Mounting Application Note, May 2015, 26 pp.

* cited by examiner

*Primary Examiner* — Cuong Q Nguyen
(74) *Attorney, Agent, or Firm* — Shumaker & Sieffert, P.A.

(57) ABSTRACT

In some examples, a device comprises an inductor and a package comprising at least one power device. The package is attached to the inductor by an adhesion layer, and the inductor comprises one or more leads. A first lead of the one or more leads is configured to conduct electricity between the at least one power device and the inductor, and a surface of the first lead and a surface of the package are substantially co-planar.

20 Claims, 12 Drawing Sheets

POWERSTAGE ATTACHED TO INDUCTOR

TECHNICAL FIELD

This disclosure relates to semiconductor packaging.

BACKGROUND

Surface-mount technology (SMT) is a production method for electronics that involves attaching components and devices on a printed circuit board (PCB). Components and devices may be soldered on the PCB to provide stability and electrical connections through traces in the PCB. The traces may conduct electricity and provide inputs and outputs for the components and devices mounted on the PCB.

SUMMARY

This disclosure describes techniques for a device comprising an inductor and a package comprising at least one power device. The package is attached to the inductor by an adhesion layer, and the inductor comprises one or more leads. A first lead of the one or more leads is configured to conduct electricity between the at least one power device and the inductor, and a surface of the first lead and a surface of the package are substantially co-planar.

In some examples, a method comprises attaching an adhesion layer to a first side of a package, wherein the package comprises at least one power device. The method further comprises attaching an inductor to the adhesion layer, wherein the inductor comprises one or more leads. A first lead of the one or more leads is configured to conduct electricity between the at least one power device and the inductor, and a surface of the first lead and a surface of the package are substantially co-planar.

In some examples, a device comprises an inductor and a package comprising at least one power device. The package is attached to the inductor by an adhesion layer, and the inductor comprises one or more leads. A first lead of the one or more leads is configured to conduct electricity between the at least one power device and the inductor, and a combined thickness of the adhesion layer and the package is substantially equal to a height of a space underneath the inductor caused by the one or more leads.

The details of one or more examples are set forth in the accompanying drawings and the description below. Other features, objects, and advantages will be apparent from the description and drawings, and from the claims.

DETAILED DESCRIPTION

Figure 1:
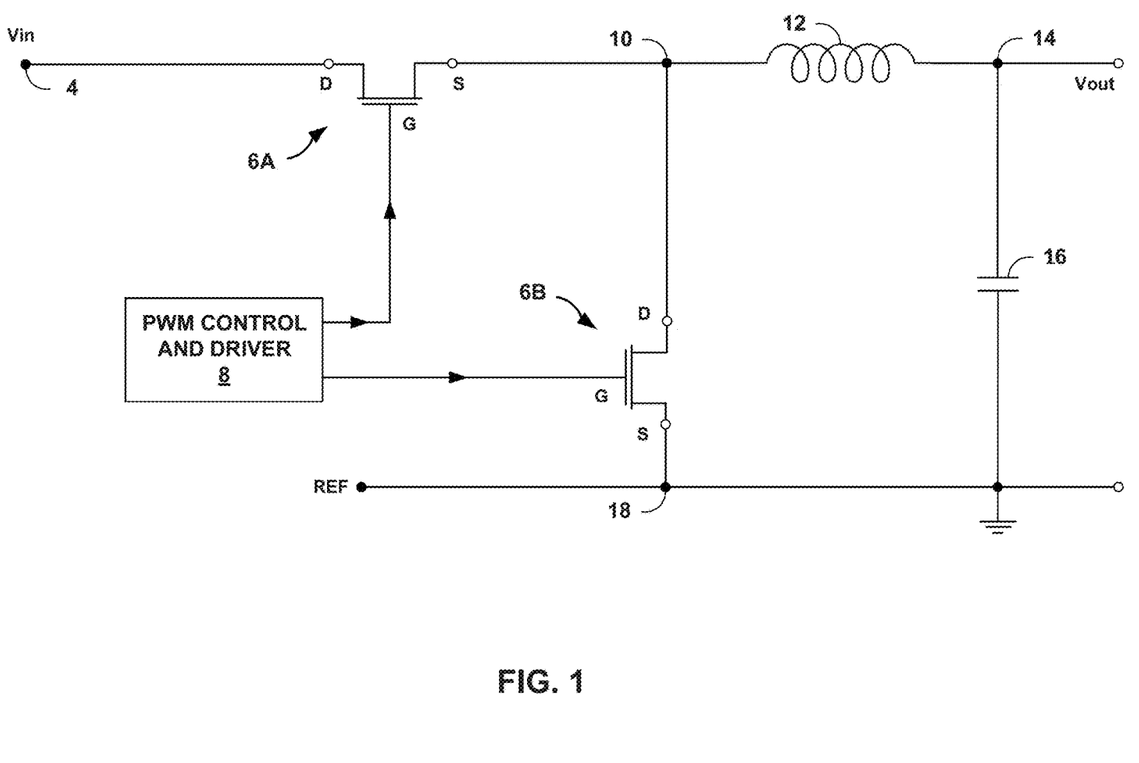
FIG. 1 is a circuit diagram for a power converter, in accordance with some examples of this disclosure.

FIG. 1 is a circuit diagram for a device 2, in accordance with some examples of this disclosure. In some examples, device 2 may comprise a multi-phase power converter such as a half-bridge direct-current-to-direct-current (DC-to-DC) buck converter for converting an input DC signal to an output DC signal with a lower voltage. For each phase, a multi-phase power converter may comprise a half-bridge circuit and an inductor. As a DC-to-DC buck converter, device 2 may operate as a voltage regulator in a variety of applications. In some examples, device 2 may be designed for high-power applications large amounts of current and high voltages. However, the techniques of this disclosure may apply to other circuits and configurations, such as other power converters, including multi-phase power converters.

Device 2 may include transistors 6A, 6B, inductor 12, capacitor 16, and pulse-width modulation (PWM) control and driver 8. In some examples, device 2 may contain more or fewer components than depicted in FIG. 1. Device 2 may include input node 4, output node 14, and reference node 18, as well as other nodes not shown in FIG. 1. Nodes 4, 14, 18 may be configured to connect to external components. For example, input node 4 may connect to an input voltage such as a power supply, output node 14 may connect to a load such as an electronic device, reference node 18 may connect to a reference voltage, such as reference ground. In some examples, PWM control and driver 8 may connect to an external circuit through a node (not shown in FIG. 1).

Although, a MOSFET symbol is shown in FIG. 1 as transistors 6A, 6B, it is contemplated that any electrical device that is controlled by a voltage may be used in place of the MOSFET as shown. For example, transistors 6A, 6B may comprise power devices, metal-oxide semiconductor (MOS) field-effect transistors (FETs), bipolar junction transistors (BJTs), and/or insulated-gate bipolar transistors (IGBTs), high-electron-mobility transistors (HEMTs), gallium-nitride (GaN) based transistors, and/or other elements that use voltage for control. Transistors 6A, 6B may comprise n-type transistors or p-type transistors. For example, an n-type MOSFET may include an n-channel for electrons to flow through a p-substrate between load terminals. In some examples, transistors 6A, 6B may comprise other analog devices such as diodes. Transistors 6A, 6B may also include freewheeling diodes connected in parallel with transistors to prevent reverse breakdown of transistors 6A, 6B. In some examples, transistors 6A, 6B may operate as switches or as analog devices.

Transistors 6A, 6B may comprise vertical power transistors. For a vertical power transistor, the source terminal and the drain terminal may be on opposite sides or opposite surfaces of the transistor. Current in a vertical power transistor may flow through the transistor from top to bottom or from bottom to top. In some examples, transistors 6A, 6B may comprise other analog devices such as diodes. In still other examples, transistors 6 may include more than two transistors, such as in multi-phase power converters or other more complex power circuits. For example, in a multi-phase power converter, device 2 may have one high-side transistor and one low-side transistor for each phase. Therefore, a multi-phase power converter may include one or more replications of device 2 as depicted in FIG. 1.

FIG. 1 depicts transistors 6A, 6B with three terminals: drain (D), source (S), and gate (G). The drain and source may be load terminals, and the gate may be a control terminal. Current may flow between the drain and source of transistors 6A, 6B, based on the voltage at the gate. Current may flow from input node 4 to switch node 10, through the drain and source of transistor 6A, based on the voltage at the gate of transistor 6A. Current may flow from switch node 10 to reference node 18, through the drain and source of transistor 10B, based on the voltage at the gate of transistor 6B. Transistor 6A may comprise a high-side transistor, and transistor 6B may comprise a low-side transistor.

Transistors 6A, 6B may comprise various material compounds, such as silicon (Si), silicon carbide (SiC), Gallium Nitride (GaN), or any other combination of one or more semiconductor materials. To take advantage of higher power density requirements in some circuits, power converters may operate at higher frequencies. Improvements in magnetics and faster switching, such as Gallium Nitride (GaN) switches, may support higher frequency converters. These higher frequency circuits may require control signals to be sent with more precise timing than for lower frequency circuits.

PWM control and driver 8 may deliver signals and/or voltages to the control terminals of transistors 6A, 6B. FIG. 1 depicts PWM control and driver 8 as one component, but the PWM control circuit and the driver circuit may be separate components. In some examples, PWM control and driver 8, only the PWM control circuit, or only the driver circuit may be located outside of device 2. Together, transistors 6A, 6B and PWM control and driver 8 may comprise a semiconductor package such as a chip-embedded substrate, an integrated circuit (IC), or any other suitable package.

Inductor 12 may comprise a coil inductor or any suitable inductor. Inductor 16 may connect to switch node 10 and output node 14. Inductor 12 may impede the flow of alternating-current (AC) electricity, while allowing DC electricity to flow between switch node 10 and output node 14.

Capacitor 16 may comprise a film capacitor, an electrolytic capacitor, a ceramic capacitor, or any suitable type of capacitor or capacitors. Capacitor 16 may be an optional component in device 2. Capacitor 16 may connect to output node 14 and reference node 18. Capacitor 16 may impede the flow of DC electricity, while allowing AC electricity to flow between output node 18 and reference node 18. Capacitor 16 may act as a smoothing capacitor for the voltage at output node 14 to moderate fluctuations in the voltage at output node 14. Capacitor 16 may be an optional component in device 2.

Figure 2:
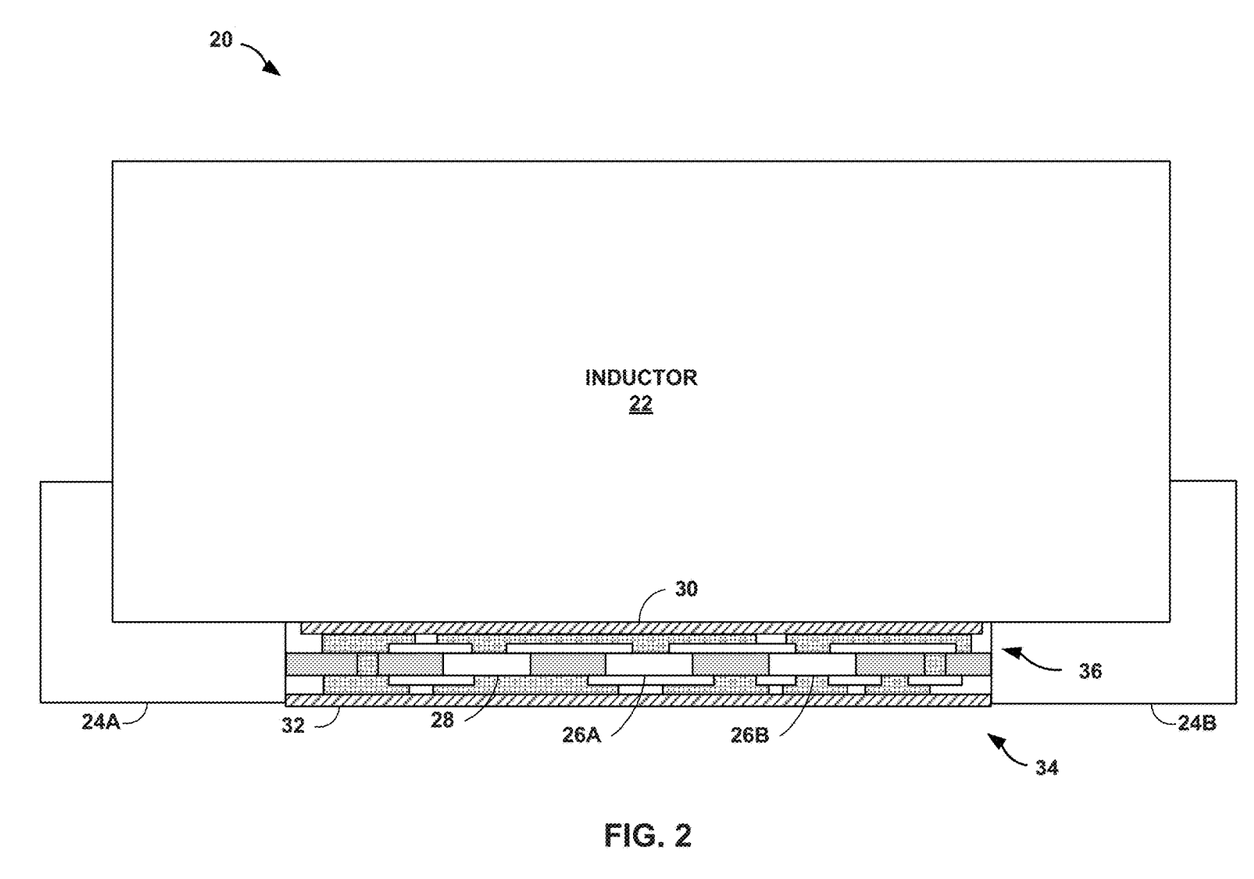
FIG. 2 is a side-view diagram of a device including an inductor and two transistors, in accordance with some examples of this disclosure.

FIG. 2 is a diagram of a device 20 including an inductor 22 and two transistors 26A, 26B, in accordance with some examples of this disclosure. Package 36 may comprise transistors 26A, 26B, driver circuit 28, and various connections between components that are internal and external to package 36. In operation and structure, device 20 may be similar to device 2 in FIG. 1, inductor 22 may be similar to inductor 12 in FIG. 1, transistors 26A, 26B may be similar to transistors 6A, 6B in FIG. 1, and driver circuit 28 may be similar to PWM control and driver 8 in FIG. 1.

Inductor 22 may comprise leads 24A, 24B and additional leads not shown in FIG. 2. Leads 24A, 24B may be configured to conduct electricity between inductor 22 and other components, such as transistors 26A, 26B, driver circuit 28, and the traces in a printed circuit board (PCB) (not shown in FIG. 2). Leads 24A, 24B may provide structural support to and hold up inductor 22. Leads 24A, 24B may have an L-shape, as shown in FIG. 2, a gull-wing shape, a straight shape, or any other suitable shape.

Transistors 26A, 26B and driver circuit 28 may be discrete devices, as depicted in FIG. 2, or transistors 26A, 26B and driver circuit 28 may be integrated into package 36, which may comprise a chip-embedded substrate. In some example, driver circuit 28 may be located outside of package 36 and/or device 20, as depicted in FIG. 2. Transistors 26A, 26B and driver circuit 28 may be electrically connected to each other and to inductor 22 in a manner similar to device 2 in FIG. 1.

Adhesion layer 30 may adhere package 36 to inductor 22. Adhesion layer 30 may also conduct electricity between package 36 and inductor 22. Adhesion layer 30 may comprise electrically conductive paste, electrically conductive glue, or any other suitable material. Adhesion layer 30 may function in a manner similar to switch node 10 in FIG. 1 by electrically connecting a terminal of transistor 26A, a terminal of transistor 26B, and inductor 22. Driver circuit 28 may be electrically connected to or isolated from adhesion layer 30 and inductor 22.

Pad 32 may connect to a bottom side of package 36. In some examples, pad 32 may comprise one or more pads for electrically transistors 26A, 26B to an input voltage and a reference voltage and driver circuit 28 to an external circuit or power supply. Pad 32 may also mount to a PCB (not shown in FIG. 2) and electrically connect to traces in the PCB.

Surface 34 may comprise a surface of lead 24A, a surface of pad 32, and a surface of lead 24B. Surface 34 may mount to a PCB and electrically connect to traces in the PCB.

In accordance with the techniques of this disclosure, surface 34 may be substantially co-planar across lead 24A, pad 32, and lead 24B. Surface 34 may be substantially co-planar such that surface 34 of device 20 may mount to a PCB and leads 24A, 24B and pad 32 may conduct electricity with traces in the PCB. The substantial co-planarity of surface 34 may allow for easy mounting of device 20 on a PCB. When mounting device 20 to a PCB, leads 24A, 24B and pad 32 may mount to the PCB. Without the substantial co-planarity of surface 34, one or more of leads 24A, 24B and pad 32 may not attach to the PCB when device 20 is mounted on the PCB. In some examples, substantial co-planarity across lead 24A, pad 32, and lead 24B may be defined as differences of less than two hundred micrometers to allow for effective soldering of lead 24A, pad 32, and lead 24B to a PCB. Differences in planarity of more than two hundred micrometers may cause improper solder connections.

The design of device 20, specifically the stacking of inductor 22 on package 36, may reduce the footprint of device 20 on the PCB. Stacking of inductor 22 on package 36 may provide a shorter conductive path for electrical current between inductor 22 and transistors 26A, 26B through adhesion layer 30, as compared to a conductive path through a PCB. Inspection of pad 32 and package 36 may also be easier because pad 32 may be exposed on one or more sides. Inspection of leads 24A, 24B may be easier because of the position of leads 24A, 24B on the outside of device 20.

Furthermore, the design of device 20 may allow for more efficient heat dissipation from package 36. Adhesion layer 30 and pad 32 may dissipate heat from package 36 more efficiently than air. Adhesion layer 30 may conduct heat to inductor 22 and leads 24A, 24B, which may absorb any heat produced by package 36. Adhesion layer 30 may transfer heat from inductor 22 to a PCB through package 36. Adhesion layer 30 may also transfer heat from package 36 to inductor 22. Without adhesion layer 30, the gap between package 36 and inductor 22 may fill with air that has poor thermal conduction, thereby building up heat and degrading the performance of device 20.

Figure 3:
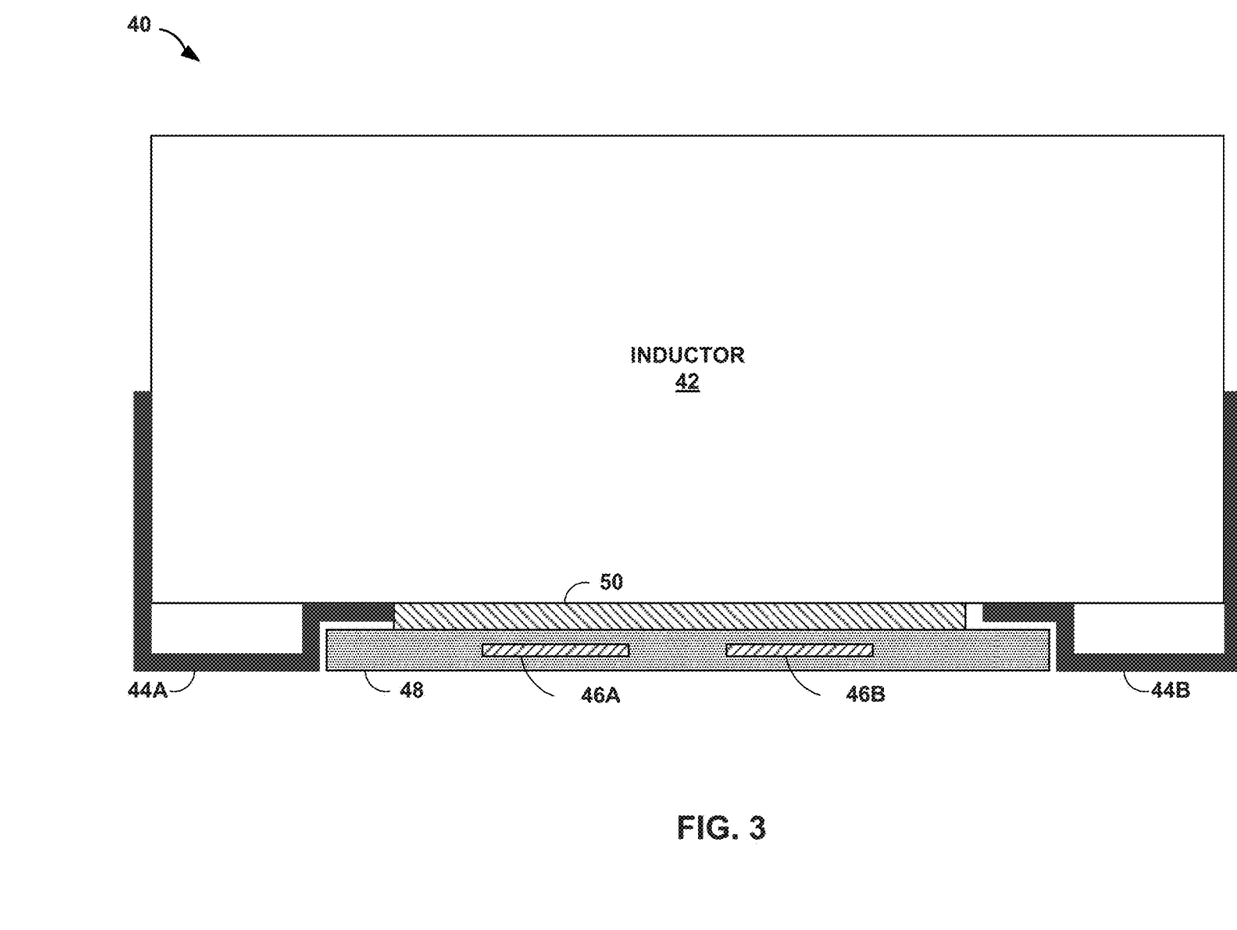
FIG. 3 is a side-view diagram of a device including a chip-embedded substrate and an inductor with two gull-wing shaped leads, in accordance with some examples of this disclosure.

FIG. 3 is a side-view diagram of a device 40 including a chip-embedded substrate 48 and an inductor 42 with two gull-wing shaped leads 44A, 44B, in accordance with some examples of this disclosure. In some examples, gull-wing shaped leads 44A, 44B may be longer and thinner than L-shaped leads, but both shapes of leads may provide similar spacing between inductor 42 and a PCB (not shown in FIG. 3). For example, gull-wing shaped leads 44A, 44B may produce a spacing between inductor 42 and a PCB that is greater than approximately five hundred micrometers and less than approximately one millimeter. The combined thickness of chip-embedded substrate 48 and adhesion layer 50 may be approximately equal to the spacing between inductor 42 and the PCB.

Chip-embedded substrate 48 may be referred to as a package and may comprise transistors 46A, 46B. The substrate of chip-embedded substrate 48 may be laminate substrate or any other suitable material. Chip-embedded substrate 48 may comprise two metal layers, one on each side, for connecting chip-embedded substrate 48 to a PCB and to adhesion layer 50. Electrical current may flow vertically or laterally through the metal layers within chip-embedded substrate 48. For example, chip-embedded substrate 48 may comprise an electrical connection to a PCB for an input voltage, a reference voltage, and a power supply for a driver circuit (not shown in FIG. 3). Chip-embedded substrate 48 may comprise an electrical connection to adhesion layer 50. Chip-embedded substrate 48 may comprise two metal layers, one on each side, for connecting to a PCB and adhesion layer 50.

Inductor 42 may attach to chip-embedded substrate 48 by adhesion layer 50. Similar to adhesion layer 30, adhesion layer 50 may conduct electricity directly between inductor 42 and components within chip-embedded substrate 48. Adhesion layer 50 may offer a lateral connection to inductor through leads 44A, 44B, instead of through traces in a PCB (not shown in FIG. 3). Gull-wing shaped lead 44A is depicted as connecting directly to adhesion layer 50 between inductor 42 and chip-embedded substrate 48. As a result, gull-wing shaped lead 44A may function similar to switch node 10 in FIG. 1.

Device 40 may be mounted on a PCB. Mounting inductor 42 on a PCB may comprise mounting leads 44A, 44B on the PCB. Mounting chip-embedded substrate 48 on the PCB may comprises mounting a side of chip-embedded substrate 48 that is opposite adhesion layer 50 to the PCB. Leads 44A, 44B and chip-embedded substrate 48 may be mounted concurrently to the PCB after device 40 is fully assembled. Device 40 may be mounted with solder on a surface of the PCB. The solder may adhere device 40 to the PCB and may conduct electricity between device 40 and traces in the PCB. A combined thickness of chip-embedded substrate 48 and adhesion layer 50 may be approximately equal to the distance between a surface of inductor 42 and the PCB.

Figure 4:
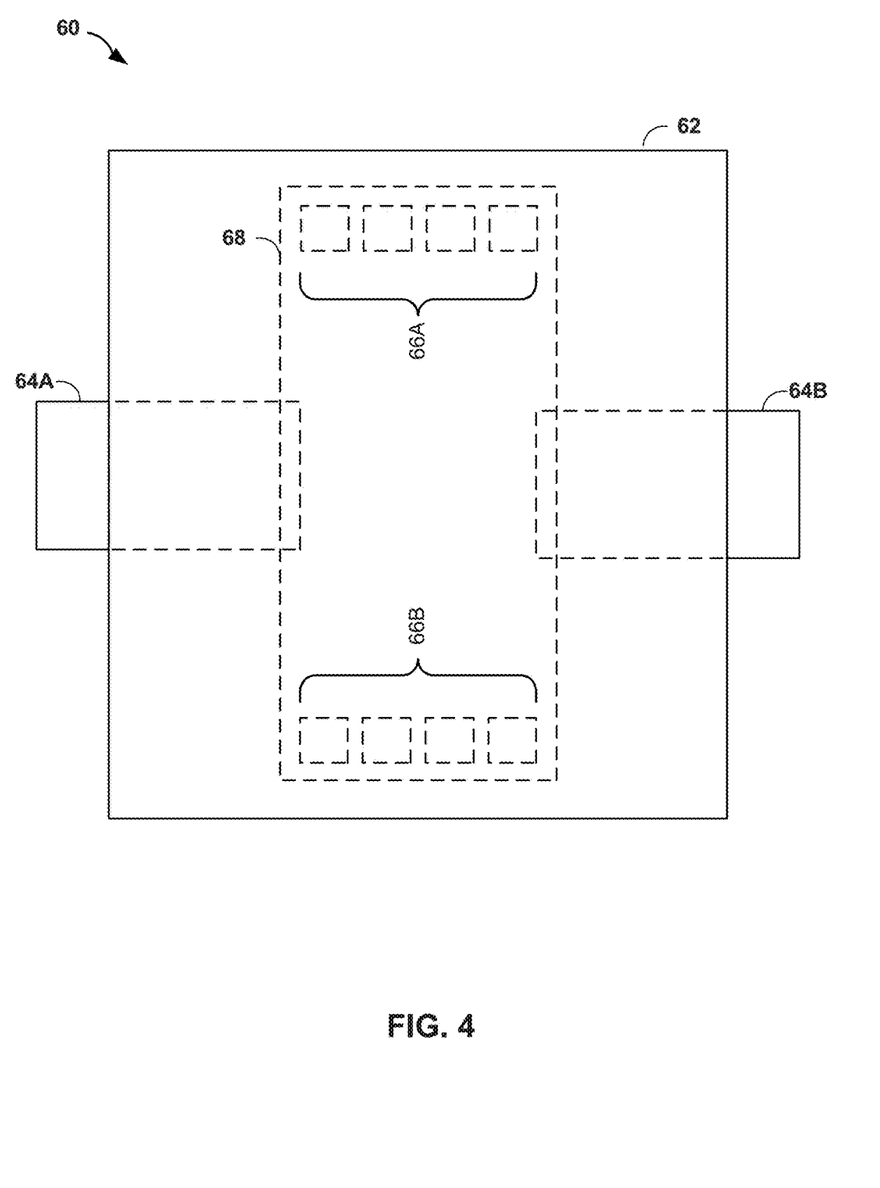
FIG. 4 is a top-view diagram of a device including a chip-embedded substrate and an inductor, in accordance with some examples of this disclosure.

FIG. 4 is a top-view diagram of a device 60 including a chip-embedded substrate 68 and an inductor 62, in accordance with some examples of this disclosure. Gull-wing shaped leads 64A, 64B may wrap around inductor 62 to contact chip-embedded substrate 68 on the top or the bottom of chip-embedded substrate 68. Chip-embedded substrate 68 may comprise electrical contacts 66A and 66B, each of which may include four contact points. Each contact point may provide an input or output for chip-embedded substrate 68, such as an input voltage, a reference voltage, or a power supply for a driver circuit (not shown in FIG. 4).

Figure 5:
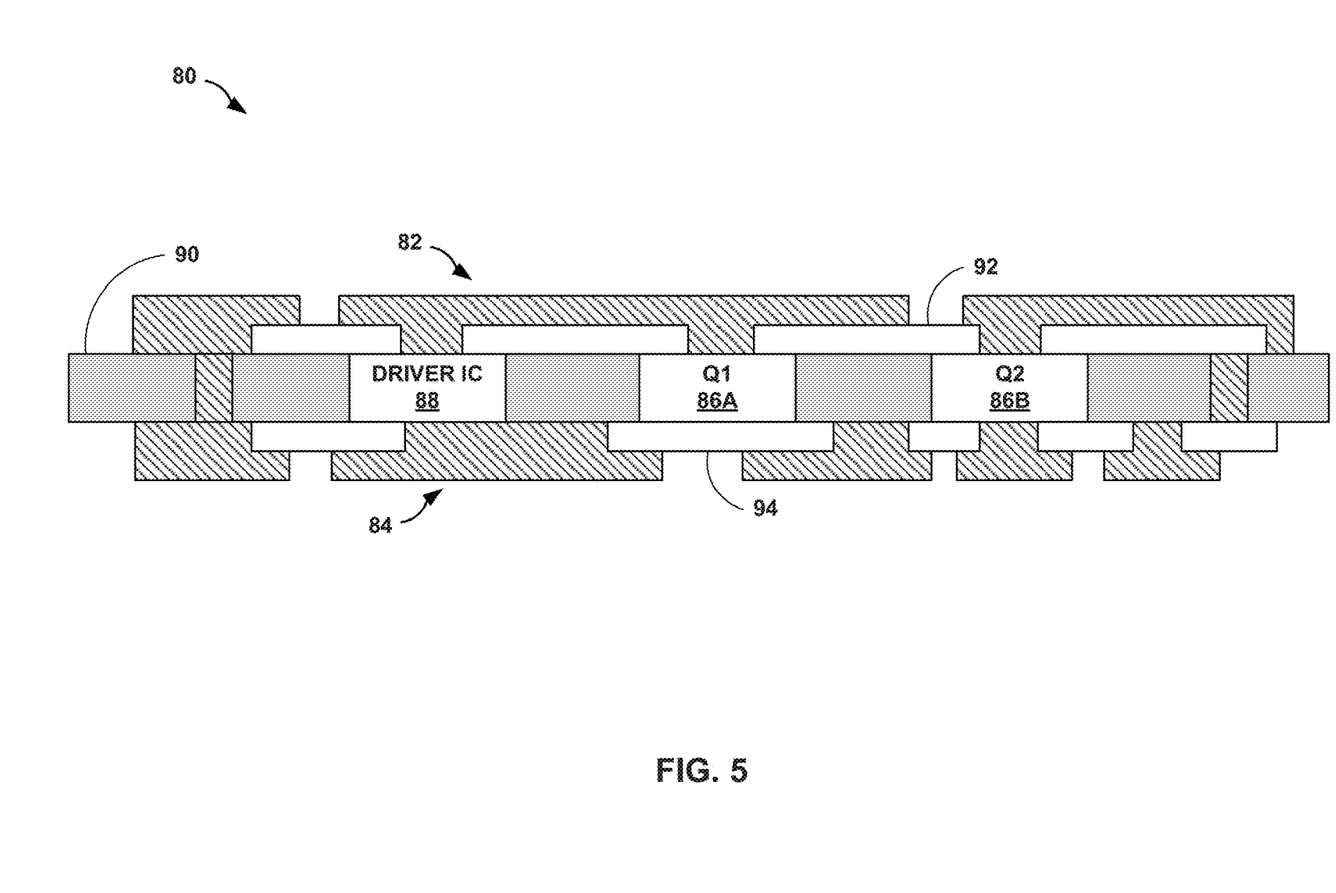
FIG. 5 is a side-view block diagram of a chip-embedded substrate with two transistors, in accordance with some examples of this disclosure.

FIG. 5 is a side-view block diagram of a chip-embedded substrate 80 with two transistors 86A, 86B, in accordance with some examples of this disclosure. Transistors 86A, 86B may be electrically insulated from each other and from driver integrated circuit (IC) 88 by substrate 90. Transistors 86A, 86B may comprise vertical FETs with a source terminal on a top side or bottom side and a drain terminal on the opposite side.

Transistors 86A, 86B may be electrically connected to each and to driver IC 88 by conductive layers 82, 84. Conductive layers 82, 84 may comprise metal such as copper, tin, solder, or any other suitable material. Insulating layers 92, 94 may comprise a solder mask or any other suitable material. Chip-embedded substrate 80 may include electrical connections into or out of the page not shown in FIG. 5, such as an electrical connection between driver IC 88 and transistor 86B.

Figure 6:
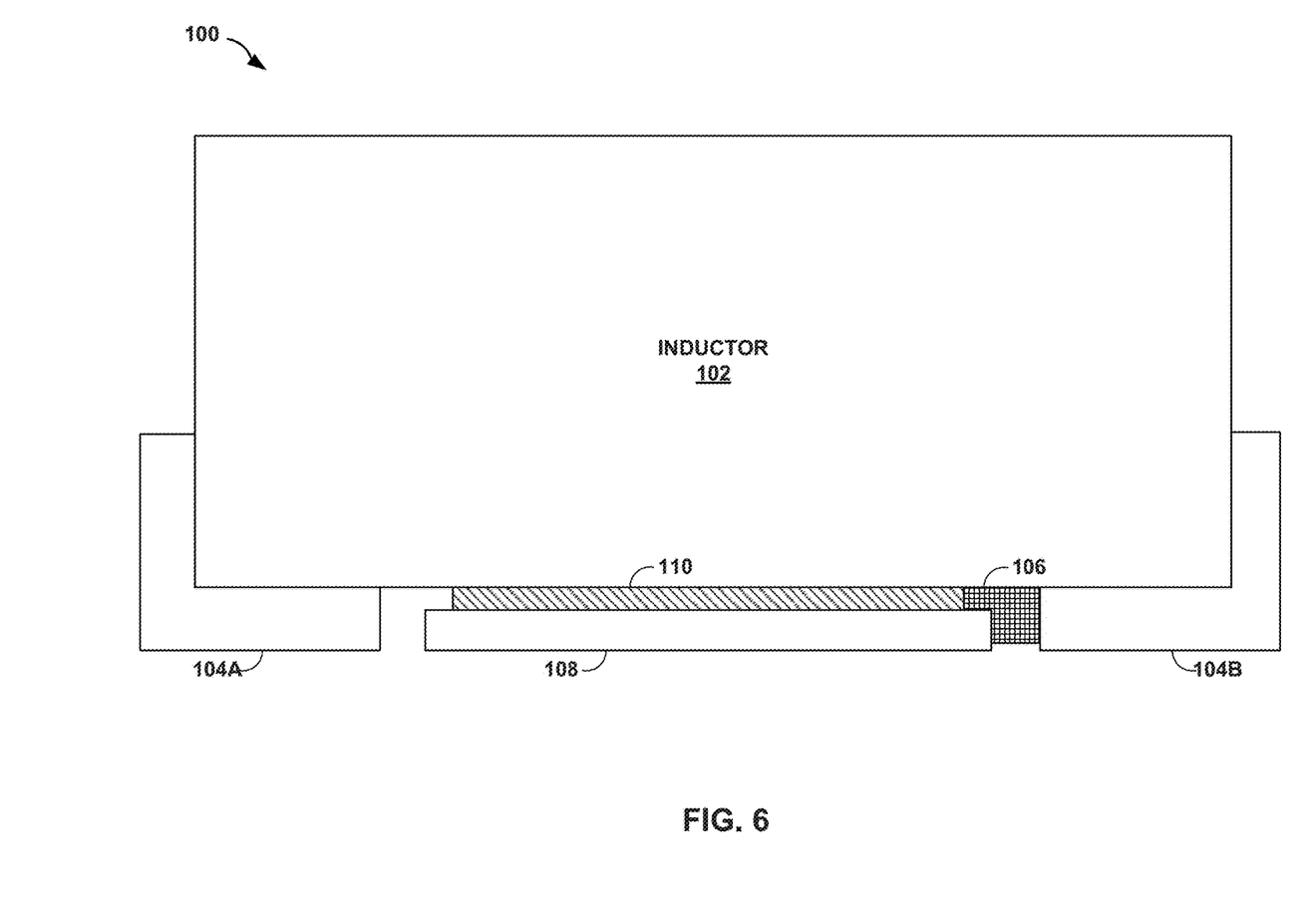
FIG. 6 is a side-view diagram of a device including a chip-embedded substrate and an inductor, in accordance with some examples of this disclosure.

FIG. 6 is a side-view diagram of a device 100 including a chip-embedded substrate 108 and an inductor 102, in accordance with some examples of this disclosure. Inductor 102 may include L-shaped leads 104A, 104B. L-shaped lead 1018 may be configured to conduct electricity with chip-embedded substrate 108 through adhesion layer 110 or a plated-through hole in chip-embedded substrate 108 (see FIGS. 8, 9). L-shaped leads 104A, 104B may have a similar thickness to the combined thickness of chip-embedded substrate 108 and adhesion layer 110. L-shaped leads 104A, 104B may have a thickness that is ten micrometers to three hundred micrometers greater than chip-embedded substrate 108. The combined thickness of chip-embedded substrate 108 and adhesion layer 110 may be approximately one hundred and fifty micrometers and less than approximately three hundred micrometers. As used herein, approximately means that a measurement is within ten percent of a limit, i.e., the measurement has a ten percent tolerance. For example, three hundred and thirty micrometers may be defined as approximately three hundred micrometers.

The switch node of chip-embedded substrate 108 may be located on the side of chip-embedded substrate 108 adjacent to conductive material 106, so that the switch node may conduct electricity with lead 104B. The switch node may comprise copper half-pillars in the side of chip-embedded substrate 108, such as the plated holes depicted in FIGS. 8 and 9. The switch node may be isolated from a PCB to prevent noise at the switch node. Other nodes or input-output pins of chip-embedded substrate 108 may be located on the side of chip-embedded substrate 108 to allow for easier fan-out. Chip-embedded substrate 108 may be referred to as a package or a semiconductor package.

Figure 7:
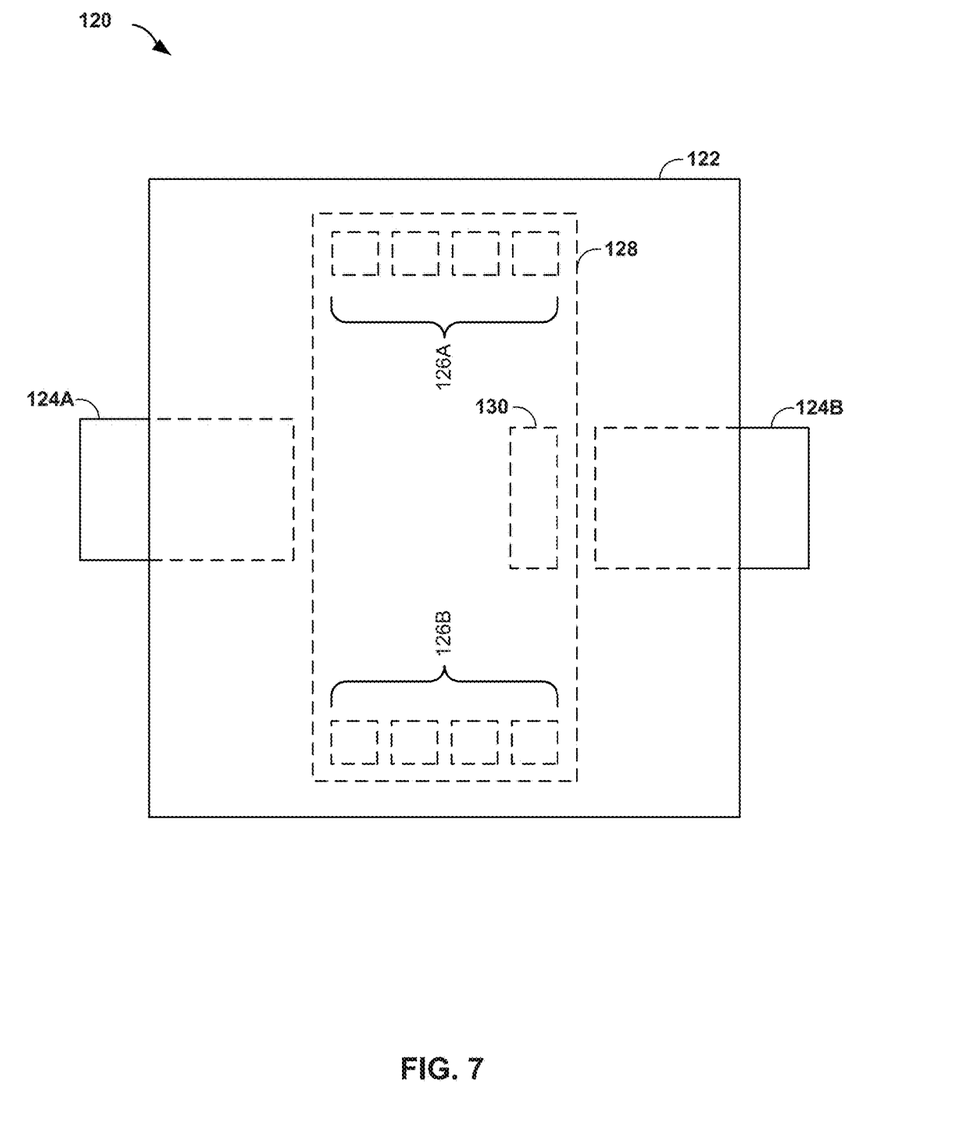
FIG. 7 is a top-view diagram of a device including a chip-embedded substrate and an inductor, in accordance with some examples of this disclosure.

FIG. 7 is a top-view diagram of a device 120 including a chip-embedded substrate 128 and an inductor 122, in accordance with some examples of this disclosure. Gull-wing shaped leads 124A, 124B may wrap around inductor 122 to contact chip-embedded substrate 128. Chip-embedded substrate 128 may comprise electrical contacts 126A and 126B, each of which may include four contact points. Chip-embedded substrate 128 may also comprise electrical contact 130, which may be configured to conduct electricity with gull-wing shaped lead 124B. As depicted in FIG. 7, the width of chip-embedded substrate 128 may be narrower than the distance between leads 124A, 124B.

Figures 8, 9:
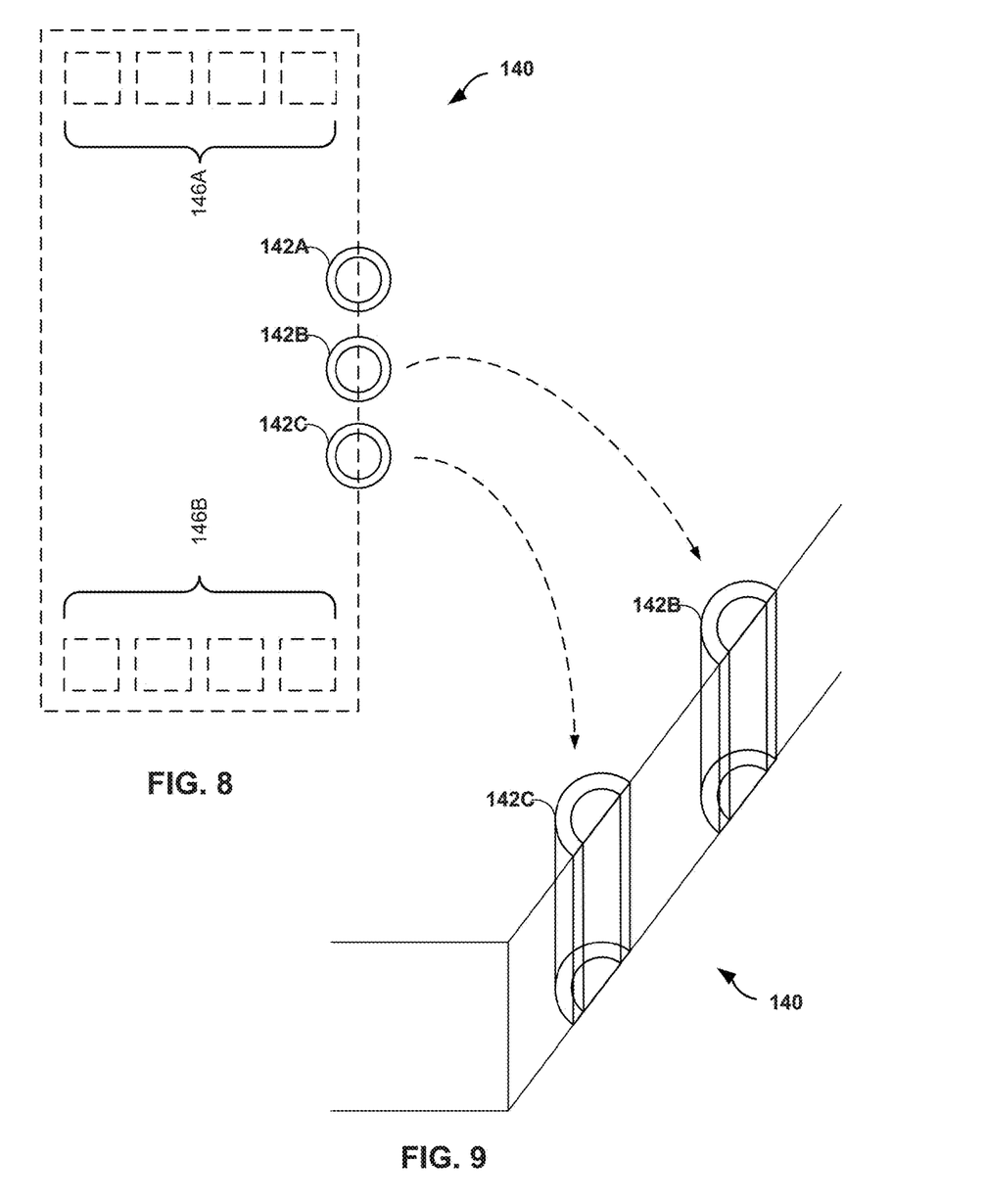
FIG. 8 is a top-view diagram of a chip-embedded substrate with plated-through holes, in accordance with some examples of this disclosure.
FIG. 9 is a perspective diagram of a chip-embedded substrate with plated-through holes, in accordance with some examples of this disclosure.

FIG. 8 is a top-view diagram of a chip-embedded substrate 140 with plated-through holes 142A-142C, in accordance with some examples of this disclosure. Chip-embedded substrate 140 may include electrical contacts 146A, 146B and plated-through holes 142A-142C, which may provide electrical contacts between components in chip-embedded substrate 140 and devices outside chip-embedded substrate 140.

Plated-through holes 142A-142C may be formed by drilling at least one hole in chip-embedded substrate 140 before attaching an inductor to an adhesion layer attached to chip-embedded substrate 140. After drilling the at least one hole in chip-embedded substrate 140, the at least one hole may be plated with a metal such as copper. The plating may conduct electricity with a power device in chip-embedded substrate 140. After plating the at least one hole, chip-embedded substrate 140 may be cut to expose a side of the at least one hole. A lead of an inductor may then be attached to the metal in a hole of the at least one hole. Plated-through holes 142A-142C may allow shorter conductive paths between an inductor and chip-embedded substrate 140, as compared to an electrical connection through a PCB. Plated-through holes 142A-142C may comprise copper pillars or copper half-pillars.

FIG. 9 is a perspective diagram of a chip-embedded substrate 140 with plated-through holes 142B, 142C, in accordance with some examples of this disclosure. Plated-through holes 142B, 142C may be exposed on the side of chip-embedded substrate 140. Plated-through holes 142B, 142C may extend along a side of chip-embedded substrate 140, allowing one or more leads of an inductor to conduct electricity between one or more power devices in chip-embedded substrate 140 and the inductor.

Figure 10:
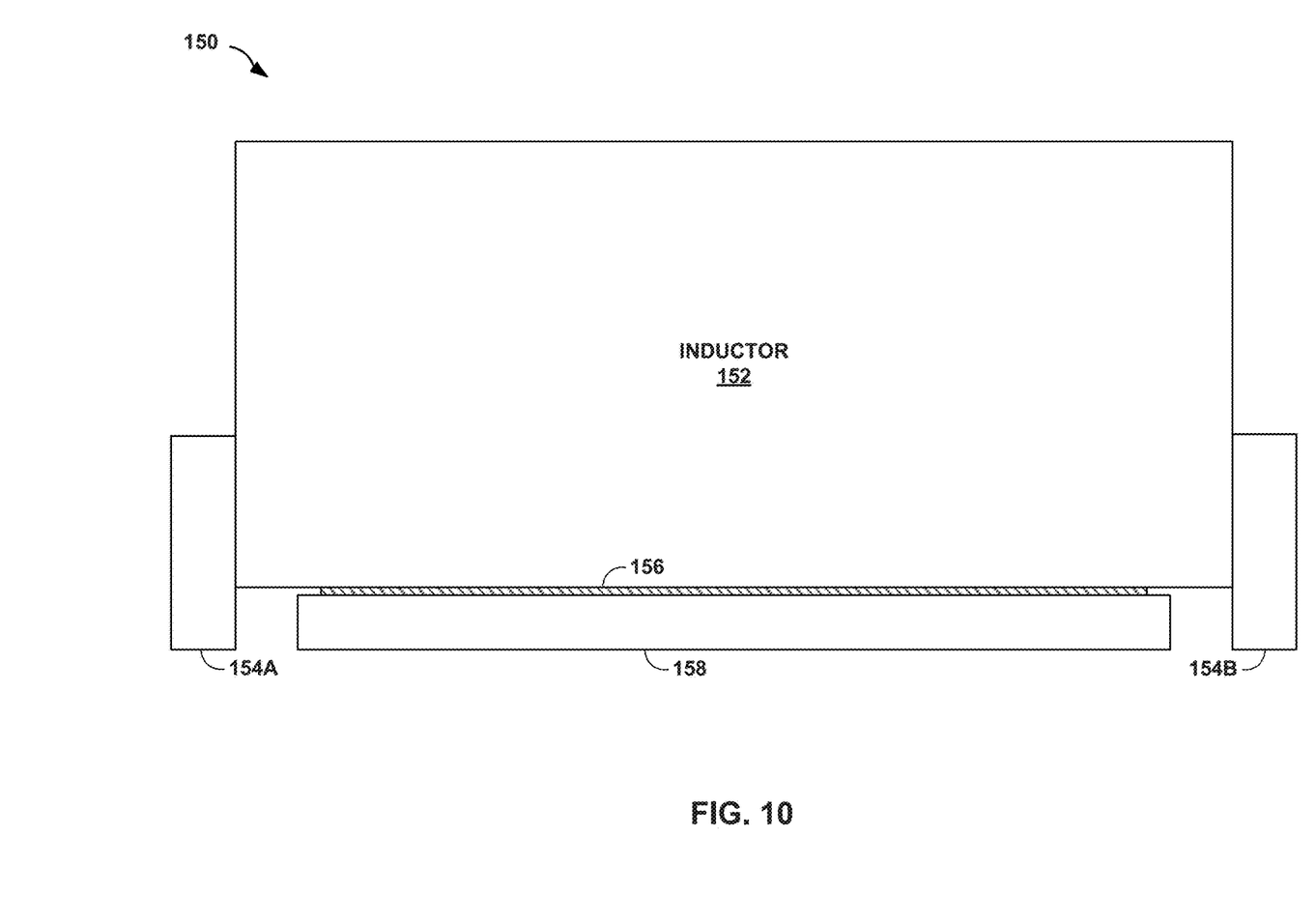
FIG. 10 is a side-view diagram of a device including a chip-embedded substrate and an inductor with straight leads, in accordance with some examples of this disclosure.

FIG. 10 is a side-view diagram of a device 150 including a chip-embedded substrate 158 and an inductor 152 with straight leads 154A, 154B, in accordance with some examples of this disclosure. Leads 154A, 154B and chip-embedded substrate 158 may mount on a PCB. Chip-embedded substrate 158 may conduct electricity with inductor 152 through leads 154A, 154B and/or adhesion layer 156. Adhesion layer 156 may comprise thermal glue or non-thermal glue depending on whether heat dissipation is desirable for device 150. Inductor 152 may act as a "heat pipe" to dissipate heat generated in chip-embedded substrate 158.

Figure 11:
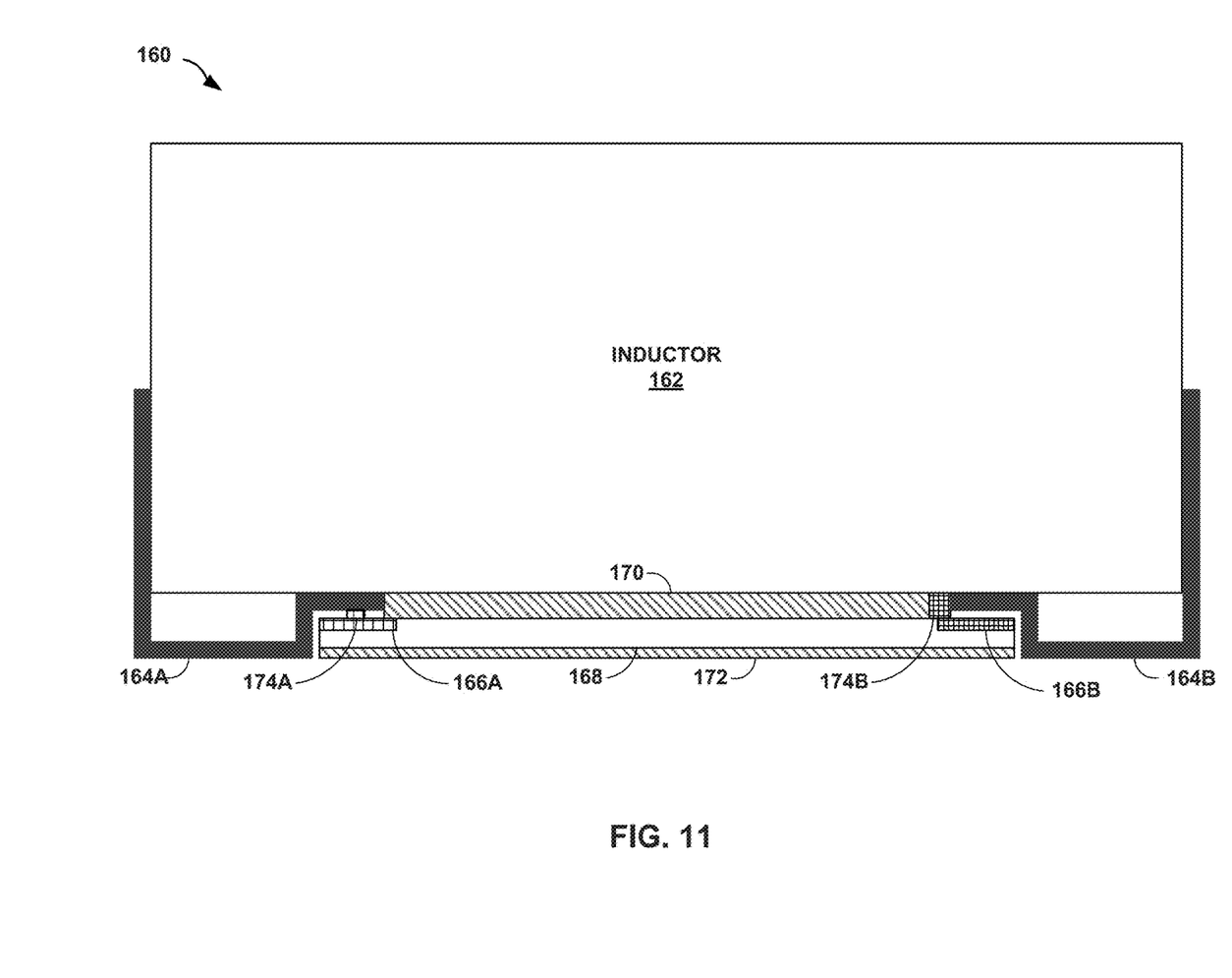
FIG. 11 is a side-view diagram of a device including a chip-embedded substrate and an inductor with gull-wing shaped leads, in accordance with some examples of this disclosure.

FIG. 11 is a side-view diagram of a device 160 including a chip-embedded substrate 168 and an inductor 162 with gull-wing shaped leads 164A, 164B, in accordance with some examples of this disclosure. Gull-wing shaped leads 164A, 164B may be configured to conduct electricity with one or more power devices in chip-embedded substrate 168 through adhesion layer 170 or through conductive pads 166A, 174A or through conductive pads 166B, 174B. Conductive pads 174A, 174B may be metal layers or metallization layers in chip-embedded substrate 168.

Figure 12:
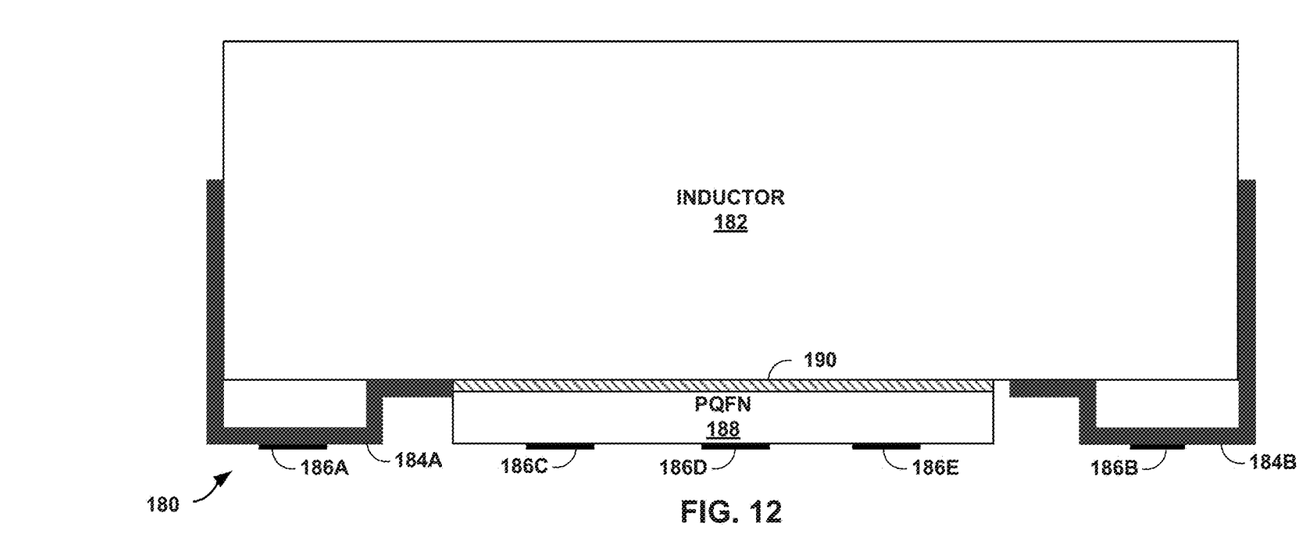
FIG. 12 is a side-view diagram of a device including a power quad flat no-lead package (PQFN), in accordance with some examples of this disclosure.

FIG. 12 is a side-view diagram of a device 180 including a power quad flat no-lead (PQFN) package 188, in accordance with some examples of this disclosure. PQFN 188 may be a substantially rectangular device comprising contact points for conducting electricity. Leads 184A, 184B and PQFN 188 may mount to a PCB through pads 186A-186E, which may be referred to as input-output pads 186A-186E. Pads 186A-186E may adhere device 180 to the PCB and conduct electricity between traces in the PCB and leads 184A, 184B and PQFN 188.

Figure 13:
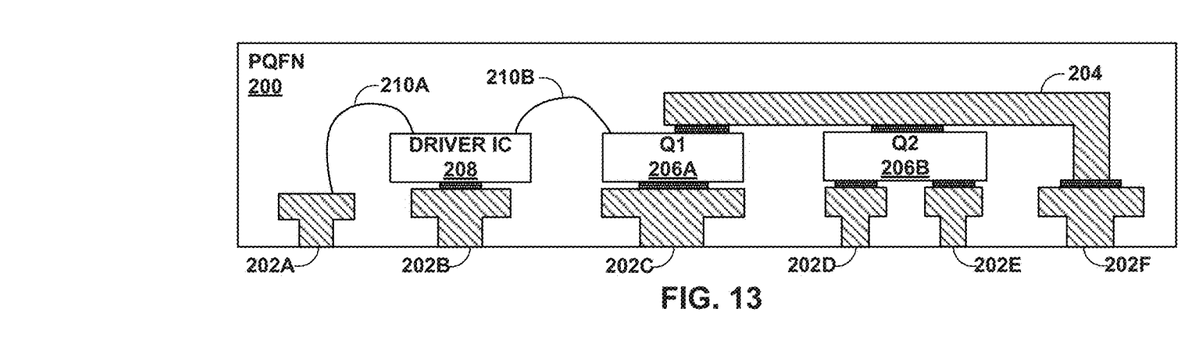
FIG. 13 is a side-view diagram of a PQFN with two transistors and a driver integrated circuit, in accordance with some examples of this disclosure.

FIG. 13 is a side-view diagram of a PQFN 200 with two transistors 206A, 206B and a driver IC 208, in accordance with some examples of this disclosure. PQFN 200 may include molding compound or any other suitable insulating material for packaging transistors 206A, 206B and driver IC 208.

Transistors 206A, 206B and driver IC 208 may conduct electricity with devices outside of PQFN 200 through layers 202A-202F and clip 204. PQFN 200 may comprise only one metal layer, including layers 202A-202F, instead of two metal layers, such as in a chip-embedded substrate. For example, driver IC 208 may conduct electricity with transistor 206A and layer 202A through wire bond 210A inside PQFN 200. Transistors 206A, 206B may conduct electricity with layer 202F through clip 204, which may comprise a metal such as copper.

Figure 14:
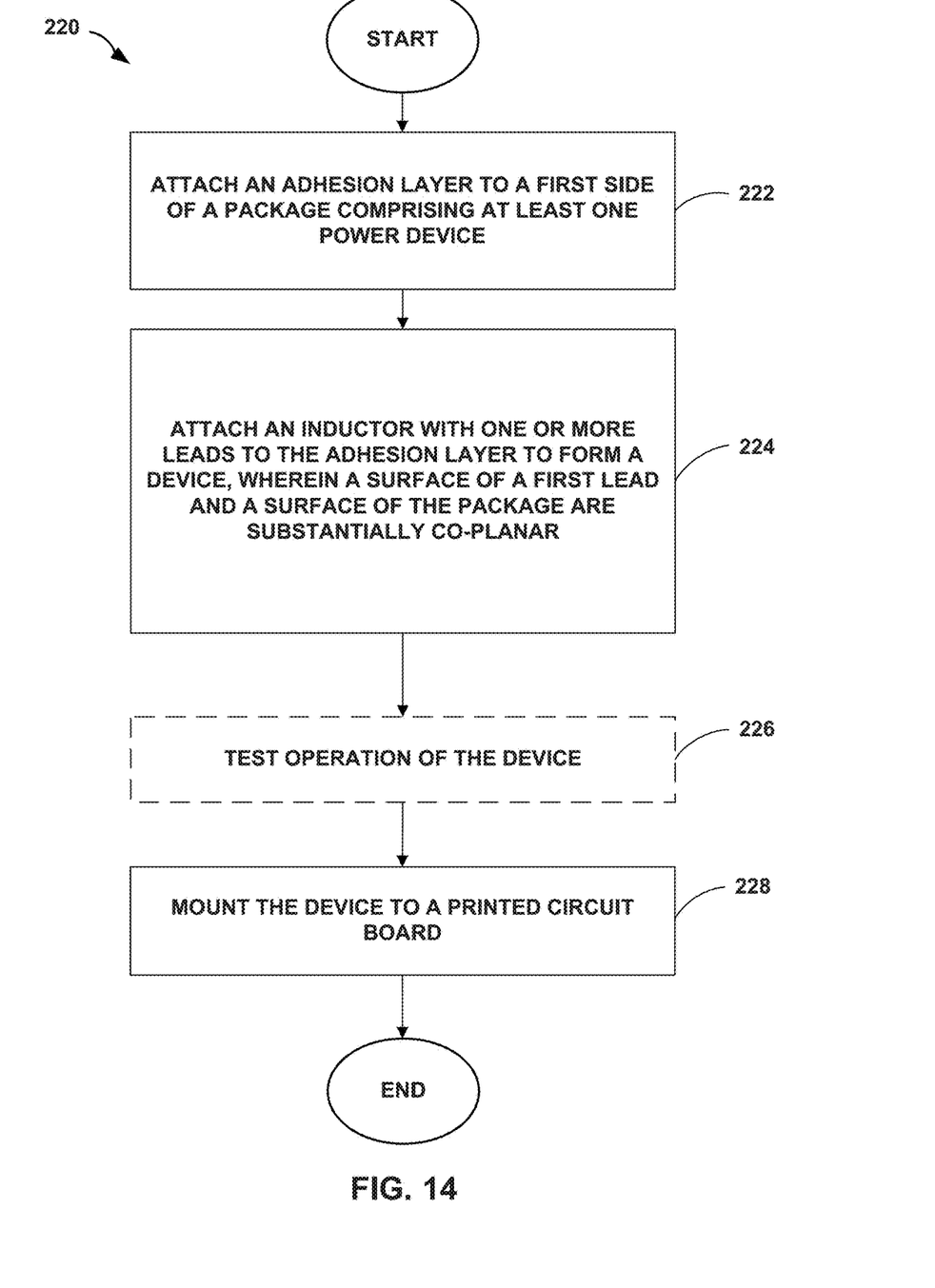
FIG. 14 is a flowchart illustrating an example process for constructing a device with a substantially co-planar surface in accordance with some examples of this disclosure.

FIG. 14 is a flowchart illustrating an example technique 220 for constructing a device with a substantially co-planar surface in accordance with some examples of this disclosure. Technique 220 is described with reference to device 20 in FIG. 2, although other components, such as devices 40, 60, 100, 120, 150, 160, 180 in FIGS. 3, 4, 6, 7, 10, 11, and 12 may exemplify similar techniques.

The technique of FIG. 14 includes attaching adhesion layer 30 to a first side of a package comprising at least one power device such as transistors 26A, 26B (222). The package may comprise one or more of transistors 26A, 26B and, optionally, driver circuit 28. Adhesion layer 30 may adhere to and conduct electricity with the package.

The technique of FIG. 14 further includes attaching inductor 22 with one or more leads 24A, 24B to adhesion layer 30 to form device 20 (224). A surface of one of the leads 24A, 24B and a surface of the package are substantially co-planar. The substantial co-planarity of the surfaces may allow leads 24A, 24B and pad 32 to mount concurrently to a PCB.

The technique of FIG. 14 further includes optionally testing operation of device 20 (226). Testing may include inspection of pad 32 and leads 24A, 24B. Testing may also include connecting device 20 to an electrical power supply and checking the output. Connecting device 20 to a power supply may test the connection between inductor 22 and transistors 26A, 26B, which may be known as the switch node. Testing may be an optional step in technique 220.

The technique of FIG. 14 further includes mounting device 20 to a PCB (228). The substantial co-planarity of the surfaces may allow device 20 to easily mount to a PCB.

Leads 24A, 24B and pad 32 may be configured to conduct electricity with traces in the PCB. The PCB may include connections to an input voltage and a reference voltage.

The following numbered examples demonstrate one or more aspects of the disclosure.

EXAMPLE 1

A device comprising an inductor and a package comprising at least one power device. The package is attached to the inductor by an adhesion layer, and the inductor comprises one or more leads. A first lead of the one or more leads is configured to conduct electricity between the at least one power device and the inductor, and a surface of the first lead and a surface of the package are substantially co-planar.

EXAMPLE 2

The circuit package of example 1, wherein the one or more leads comprise an L-shaped lead, and the combined thickness of the adhesion layer and the package is greater than approximately one hundred and fifty micrometers and less than approximately three hundred micrometers.

EXAMPLE 3

The circuit package of any combination of examples 1-2, wherein the one or more leads comprise at least two L-shaped leads, and the package comprises a chip-embedded substrate comprising the at least one power device. The first lead is configured to conduct electricity between the chip-embedded substrate and the inductor through at least one copper pillar in the chip-embedded substrate.

EXAMPLE 4

The circuit package of any combination of examples 1-3, wherein the one or more leads comprise a gull-wing shaped lead, and the combined thickness of the adhesion layer and the package is greater than approximately five hundred micrometers and less than approximately one millimeter.

EXAMPLE 5

The circuit package of any combination of examples 1-4, wherein the package comprises at least one input-output pad, and the at least one power device is configured to conduct electricity with a first trace in a printed circuit board (PCB) through the at least one input-output pad. A second lead of the one or more leads is configured to conduct electricity with a second trace in the PCB.

EXAMPLE 6

The circuit package of any combination of examples 1-5, wherein the at least one power device comprises two vertical field-effect transistors, a load terminal of each vertical field-effect transistor of the two vertical field-effect transistors is electrically coupled to the first lead, and the first lead is not electrically coupled to a printed circuit board.

EXAMPLE 7

The circuit package of any combination of examples 1-6, wherein the package comprises a chip-embedded substrate comprising the at least one power device; and the first lead is electrically coupled to one or more copper pillars in a side of the chip-embedded substrate.

EXAMPLE 8

The circuit package of any combination of examples 1-7, wherein the package and the first lead are configured to be surface mounted, concurrently and with solder, to a printed circuit board.

EXAMPLE 9

The circuit package of any combination of examples 1-8, wherein a combined thickness of the adhesion layer and the package is substantially equal to a thickness of the one or more leads.

EXAMPLE 10

The circuit package of any combination of examples 1-9, wherein the package comprises a power integrated circuit (IC), the device further comprising a control IC configured to deliver control signals to the power IC, and a half-bridge circuit comprising the package and the control IC.

EXAMPLE 11

The circuit package of example 10, further comprising a multi-phase voltage regulator comprising the half-bridge circuit and the inductor, at least one additional half-bridge circuit, and at least one additional inductor.

EXAMPLE 12

The circuit package of any combination of examples 1-11, wherein a combined thickness of the package and the adhesion layer is approximately equal to a distance between a bottom surface of the inductor and a printed circuit board.

EXAMPLE 13

A method comprises attaching an adhesion layer to a first side of a package, wherein the package comprises at least one power device. The method further comprises attaching an inductor to the adhesion layer, wherein the inductor comprises one or more leads. A first lead of the one or more leads is configured to conduct electricity between the at least one power device and the inductor, and a surface of the first lead and a surface of the package are substantially co-planar.

EXAMPLE 14

The method of example 13, further comprising mounting a second side of the package to a printed circuit board (PCB), and mounting the inductor to the PCB, wherein mounting the second side of the package to the PCB and mounting the inductor to the PCB are performed concurrently.

EXAMPLE 15

The method of example 13 or 14, wherein mounting the second side of the package to the PCB comprises mounting, with solder, the second side of the package to a surface of the PCB. The method further comprises mounting the inductor to the PCB comprises mounting, with solder, the inductor to the surface of the PCB.

EXAMPLE 16

The method of any combination of examples 13-15, wherein a combined thickness of the adhesion layer and the package is substantially equal to a height of a space underneath the inductor caused by the one or more leads.

EXAMPLE 17

The method of any combination of examples 13-16, further comprising drilling at least one hole in a chip-embedded substrate before attaching the inductor to the adhesion layer, wherein the package comprises the chip-embedded substrate, wherein the chip-embedded substrate comprises the at least one power device. The method further comprises plating the at least one hole with copper; cutting the chip-embedded substrate to expose the at least one hole, and attaching a lead of the one or more leads to the copper in a hole of the at least one hole.

EXAMPLE 18

A device comprises an inductor and a package comprising at least one power device. The package is attached to the inductor by an adhesion layer, and the inductor comprises one or more leads. A first lead of the one or more leads is configured to conduct electricity between the at least one power device and the inductor, and a combined thickness of the adhesion layer and the package is substantially equal to a height of a space underneath the inductor caused by the one or more leads.

EXAMPLE 19

The device of example 18, wherein the one or more leads comprise a gull-wing shaped lead, and the combined thickness of the adhesion layer and the package is greater than approximately five hundred micrometers and less than approximately one millimeter.

EXAMPLE 20

The device of example 18 or 19, wherein a surface of the first lead and a surface of the package are substantially co-planar.

EXAMPLE 21

The device of any combination of examples 18-20, wherein the package and the first lead are configured to be concurrently surface mounted, with solder, to a printed circuit board.

Various examples of the disclosure have been described. Any combination of the described systems, operations, or functions is contemplated. These and other examples are within the scope of the following claims.

What is claimed is:

1. A device comprising:
    a package comprising at least one power device;
    an inductor, wherein:
        the package is attached to the inductor by an adhesion layer,
        the inductor comprises one or more leads,
        a first lead of the one or more leads is configured to conduct electricity between the at least one power device and the inductor, and
        wherein a surface of the first lead and a surface of the package are substantially co-planar.

2. The device of claim 1, wherein:
    the one or more leads comprise an L-shaped lead; and
    the combined thickness of the adhesion layer and the package is greater than approximately one hundred and fifty micrometers and less than approximately three hundred micrometers.

3. The device of claim 1, wherein:
    the one or more leads comprise at least two L-shaped leads;
    the package comprises a chip-embedded substrate comprising the at least one power device; and
    the first lead is configured to conduct electricity between the chip-embedded substrate and the inductor through at least one copper pillar in the chip-embedded substrate.

4. The device of claim 1, wherein:
    the one or more leads comprise a gull-wing shaped lead; and
    the combined thickness of the adhesion layer and the package is greater than approximately five hundred micrometers and less than approximately one millimeter.

5. The device of claim 1, wherein:
    the package comprises at least one input-output pad;
    the at least one power device is configured to conduct electricity with a first trace in a printed circuit board (PCB) through the at least one input-output pad; and
    a second lead of the one or more leads is configured to conduct electricity with a second trace in the PCB.

6. The device of claim 1, wherein:
    the at least one power device comprises two vertical field-effect transistors;
    a load terminal of each vertical field-effect transistor of the two vertical field-effect transistors is electrically coupled to the first lead; and
    the first lead is not electrically coupled to a printed circuit board.

7. The device of claim 6, wherein:
    the package comprises a chip-embedded substrate comprising the at least one power device; and
    the first lead is electrically coupled to one or more copper pillars in a side of the chip-embedded substrate.

8. The device of claim 1, wherein the package and the first lead are configured to be surface mounted, concurrently and with solder, to a printed circuit board.

9. The device of claim 1, wherein a combined thickness of the adhesion layer and the package is substantially equal to a thickness of the one or more leads.

10. The device of claim 1, wherein the package comprises a power integrated circuit (IC), the device further comprising:
    a control IC configured to deliver control signals to the power IC; and
    a half-bridge circuit comprising:
        the package; and
        the control IC.

11. The device of claim 10, further comprising a multi-phase voltage regulator comprising:
    the half-bridge circuit;
    the inductor;
    at least one additional half-bridge circuit; and
    at least one additional inductor.

12. The device of claim 1, wherein a combined thickness of the package and the adhesion layer is approximately equal to a distance between a bottom surface of the inductor and a printed circuit board.

13. A method comprising:
attaching an adhesion layer to a first side of a package, wherein the package comprises at least one power device;
attaching an inductor to the adhesion layer, wherein:
the inductor comprises one or more leads,
a first lead of the one or more leads is configured to conduct electricity between the at least one power device and the inductor, and
a surface of the first lead and a surface of the package are substantially co-planar.

14. The method of claim 13, further comprising:
mounting a second side of the package to a printed circuit board (PCB); and
mounting the inductor to the PCB,
wherein mounting the second side of the package to the PCB and mounting the inductor to the PCB are performed concurrently.

15. The method of claim 13, wherein:
mounting the second side of the package to the PCB comprises mounting, with solder, the second side of the package to a surface of the PCB; and
mounting the inductor to the PCB comprises mounting, with solder, the inductor to the surface of the PCB.

16. The method of claim 13, wherein a combined thickness of the adhesion layer and the package is substantially equal to a height of a space underneath the inductor caused by the one or more leads.

17. The method of claim 13, further comprising:
drilling at least one hole in a chip-embedded substrate before attaching the inductor to the adhesion layer, wherein the package comprises the chip-embedded substrate, wherein the chip-embedded substrate comprises the at least one power device;
plating the at least one hole with copper;
cutting the chip-embedded substrate to expose the at least one hole; and
attaching a lead of the one or more leads to the copper in a hole of the at least one hole.

18. A device comprising:
a package comprising at east one power device;
an inductor, wherein:
the package is attached to the inductor by an adhesion layer,
the inductor comprises one or more leads,
a first lead of the one or more leads is configured to conduct electricity between the at least one power device and the inductor, and
a combined thickness of the adhesion layer and the package is substantially equal to a height of a space underneath the inductor caused by the one or more leads.

19. The device of claim 18, wherein:
the one or more leads comprise a gull-wing shaped lead; and
the combined thickness of the adhesion layer and the package is greater than approximately five hundred micrometers and less than approximately one millimeter.

20. The device of claim 18, wherein a surface of the first lead and a surface of the package are substantially co-planar.

* * * * *